United States Patent
Nouban et al.

(10) Patent No.: US 6,894,531 B1
(45) Date of Patent: May 17, 2005

(54) INTERFACE FOR A PROGRAMMABLE LOGIC DEVICE

(75) Inventors: Behzad Nouban, Los Altos, CA (US);
Toan D. Do, San Jose, CA (US);
Pooyan Khoshkhoo, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/444,741

(22) Filed: May 22, 2003

(51) Int. Cl.[7] .............................................. H03K 19/173
(52) U.S. Cl. ........................... 326/38; 326/39; 326/40; 365/189.04; 365/230.04
(58) Field of Search .................. 326/38–41; 365/230.04, 365/230.03, 230.08, 233

(56) References Cited

U.S. PATENT DOCUMENTS

| | | | | |
|---|---|---|---|---|
| 6,020,759 A | * | 2/2000 | Heile | .......................... 326/40 |
| 6,094,375 A | * | 7/2000 | Lee | ......................... 365/189.04 |
| 6,151,271 A | * | 11/2000 | Lee | ............................. 365/233 |
| 6,275,441 B1 | * | 8/2001 | Oh | ......................... 365/230.04 |
| 6,472,904 B2 | * | 10/2002 | Andrews et al. | .............. 326/38 |
| 6,686,769 B1 | * | 2/2004 | Nguyen et al. | ................ 326/46 |
| 6,806,733 B1 | * | 10/2004 | Pan et al. | ...................... 326/41 |

* cited by examiner

*Primary Examiner*—Vibol Tan (57) ABSTRACT

The present invention provides circuitry for implementing a multiple data rate interface architectures for programmable logic devices. The programmable logic device of the invention includes a core and surrounding periphery. The core includes a plurality of logic elements arranged in an array. Some of the logic elements within the core include registers that are used as data registers for the multiple data rate interface.

18 Claims, 7 Drawing Sheets

DDR Read Block Diagram

DDR Read Block Diagram

DDR Write Block Diagram

INTERFACE FOR A PROGRAMMABLE LOGIC DEVICE

BACKGROUND OF THE INVENTION

This invention relates to input/output interfaces for integrated circuits. More particularly, this invention relates to a system and method for distributing clock signals in a programmable logic device (PLD) that employs a multiple data rate interface.

Various high speed interface mechanisms have been developed to increase the speed of data transfer and data throughput between integrated devices. One such mechanism is a multiple data rate interface scheme. In a multiple data rate interface scheme, two or more bits of data are transferred during each clock period.

One example of multiple data rate technology is the double data rate ("DDR") technology. In DDR, two data operations are performed in one clock cycle, thus achieving twice the data throughput. This technology has enhanced the bandwidth performance of integrated circuits used in a wide array of applications from computers to communication systems. The DDR technique is being employed in, for example, today's synchronous dynamic random access memory (SDRAM) circuits.

Figure 1:
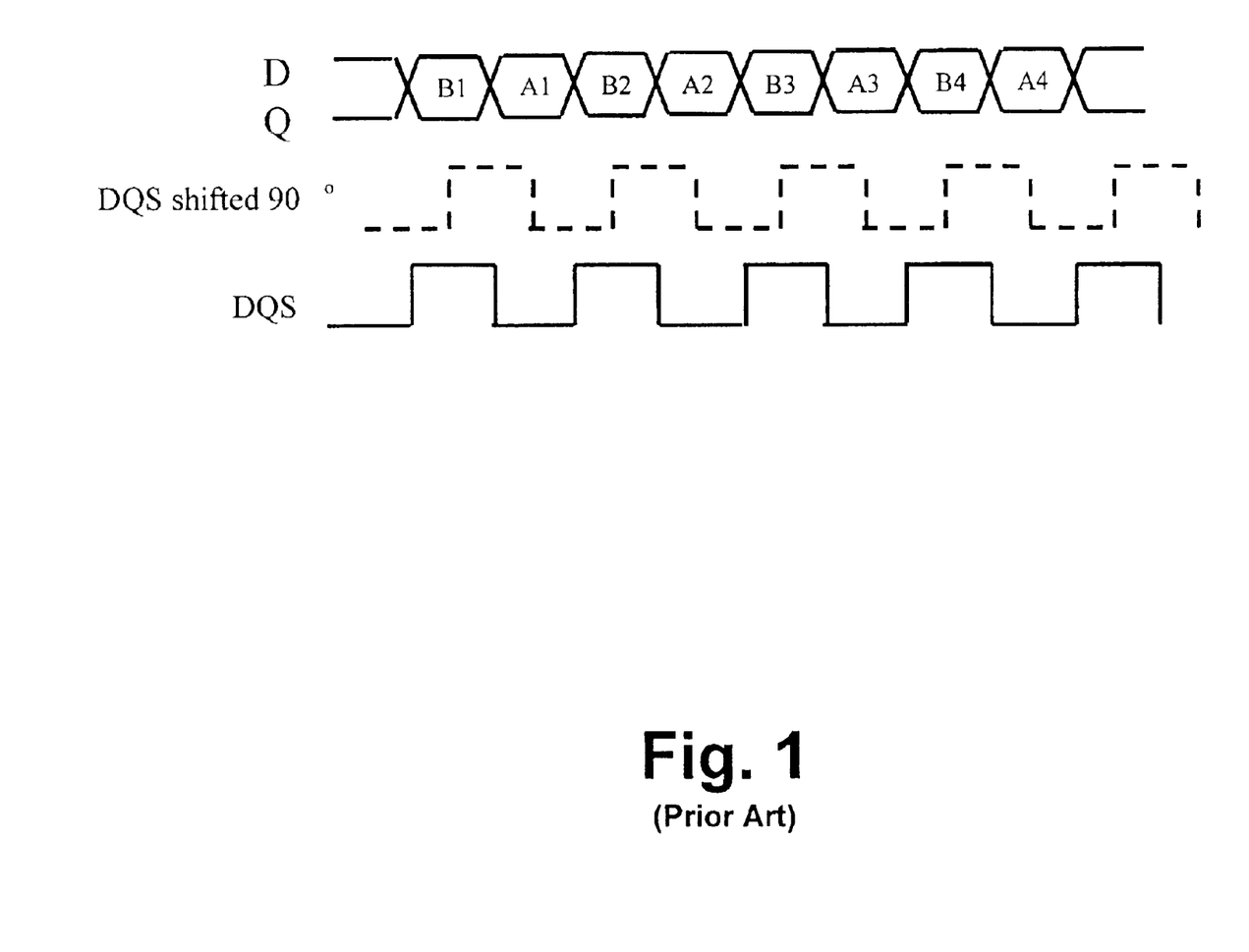
FIG. 1 illustrates the timing relationship between the data and clock signals in a DDR interface.

FIG. 1 illustrates the timing relationship between the data and clock signals in a DDR interface. DDR implementation processes I/O data (also referred to as DQ signals) using both the rising edge and the falling edge of a clock signal (the DQS signal) that functions as a data strobe to control the timing of data transfer. DQS is normally edge-aligned with DQ for a DDR interface operating in the read mode and center aligned for a DDR interface operating in the write mode.

For optimum sampling of data, internal to the integrated circuit, DQS is delayed by one-quarter of the clock period to achieve a 90 degree phase shift between the edges of DQ and DQS. This ensures that the DQS edge occurs as close to the center of the DQ pulse as possible as shown in FIG. 1. It is desirable to implement this 90 degree phase shift as accurately and in as stable a manner as possible.

Generally, a programmable logic device having a multiple data rate interface includes a programmable logic core comprising an array of logic elements and a periphery that among other circuitry includes I/O circuitry. The I/O circuitry of a programmable logic device having a multiple data rate interface includes dedicated I/O registers for performing the functions associated with the multiple data rate interface. The DQS signal is applied to a phase locked loop (PLL) or a delay chain to generate the required phase shift and alignment. The DQ signals are applied directly to respective I/O registers whose clock inputs receive the phase-corrected DQS signal.

Where an application does not need a multiple data rate interface or where the application does not utilize all of the registers within the logic elements of the programmable logic core, the dedicated I/O registers take up valuable periphery space that may be used for other functions or that may be eliminated to reduce chip size. Thus, there is a need in the art for a multiple data rate interface that does not use dedicated I/O registers in the periphery of the device.

SUMMARY OF THE INVENTION

The present invention provides circuitry for implementing a multiple data rate interface architecture for programmable logic devices. The programmable logic device of the invention includes a core and surrounding periphery. The core includes a plurality of logic elements arranged in an array. Some of the logic elements within the core include registers that are used as data registers for the register block of the multiple data rate interface.

In the read mode, the multiple data rate interface includes a plurality of data lines and a clock line located centrally with respect to the data lines. Each data line is connected to a buffer which in turn is connected to a register block. The clock line is connected to a different buffer which in turn is connected to a delay circuit. The output of the delay circuit is connected to the register block located within the core of the programmable logic device. The register block includes a plurality of data registers for implementing the various operations of the multiple data rate interface. Preferably, the register block includes two data registers.

The two data registers are located within the core of the programmable logic device. The data lines and clock line are located in the periphery of the device. The buffers and delay circuit can be located either within the core or in the periphery.

In the write mode, the multiple data rate interface includes a plurality of data lines and a clock line located centrally with respect to the data lines. Each data line and the clock is connected to a buffer which in turn is connected to a logic gate and a multiplexer. In one embodiment, the logic gate is connected to two data registers and the multiplexer is connected to an additional two data registers. The registers accept inputs from a delay circuit which are then fed to the data lines.

Again, the data registers are located within the core of the programmable logic device. The data lines and the clock line are located in the periphery of the device. The buffers, logic gates, multiplexers and the delay circuit can be located either within the core or in the periphery.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

This invention is directed to a system and method for distributing clock signals in a programmable logic device (PLD) that employs a multiple data rate interface. The programmable logic device of the invention includes a core and surrounding periphery. The core includes a plurality of logic elements arranged in an array. Some of the logic elements within the core include registers that are used as data registers for the register block of the multiple data rate interface.

The present invention is described in the context of a double-data rate (DDR) system. However, those skilled in the art will appreciate that the principles of this invention can be applied to any multiple data rate interface, such as quad data rate.

Figure 2:
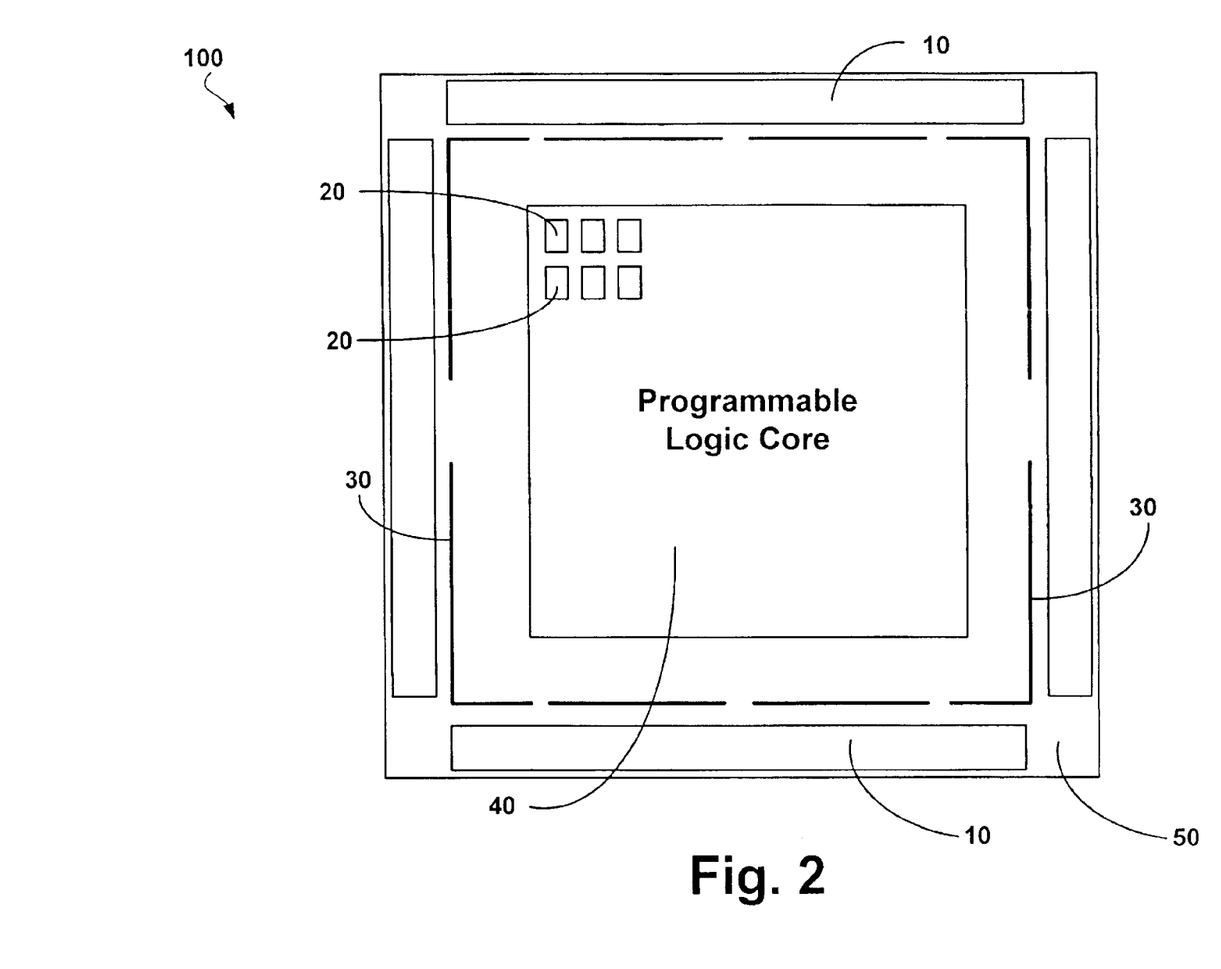
FIG. 2 shows an illustrative programmable logic device that can be constructed or readily modified in accordance with various features of the invention.

FIG. 2 shows an illustrative programmable logic device that can be constructed or readily modified in accordance with various features of the invention. It will be understood that device 100 is exemplary of the type of device in which the invention can be used. Those skilled in the art will appreciate that the present invention is equally applicable to many other types and construction of logic array devices.

Device 100 includes a programmable logic core 40 and periphery 50. Programmable logic core 40 includes a plurality of logic elements 20 disposed on the device in a two-dimensional array of intersecting rows and columns of such regions. Logic elements 20 include programmable registers, preferably flip-flops. Logic elements 20 may further include look-up tables or universal logic blocks, pterms, carry and cascade chains and other circuitry to perform various functions of the programmable logic device. In some embodiments, a plurality of logic elements in the array may be grouped to form logic array blocks.

The core 40 may further include circuitry for interconnecting the logic elements. Additionally, core 40 may include other circuitry for performing various functions on the programmable logic device such as embedded memory arrays or DSP blocks.

The periphery 50 includes a plurality of Input/Output elements 10 and power bus segments 30. Input/Output elements 10 transmit information to and from the programmable logic device to other devices in a system. Power bus segments 30 supply power to the various components of the programmable logic device 100. In alternate embodiments, portions of the power bus segments 30 may be included in the core. The periphery 50 may further include other circuitry to implement the various functions of the programmable logic device such as phase-locked loops or transceiver blocks.

Figure 3:
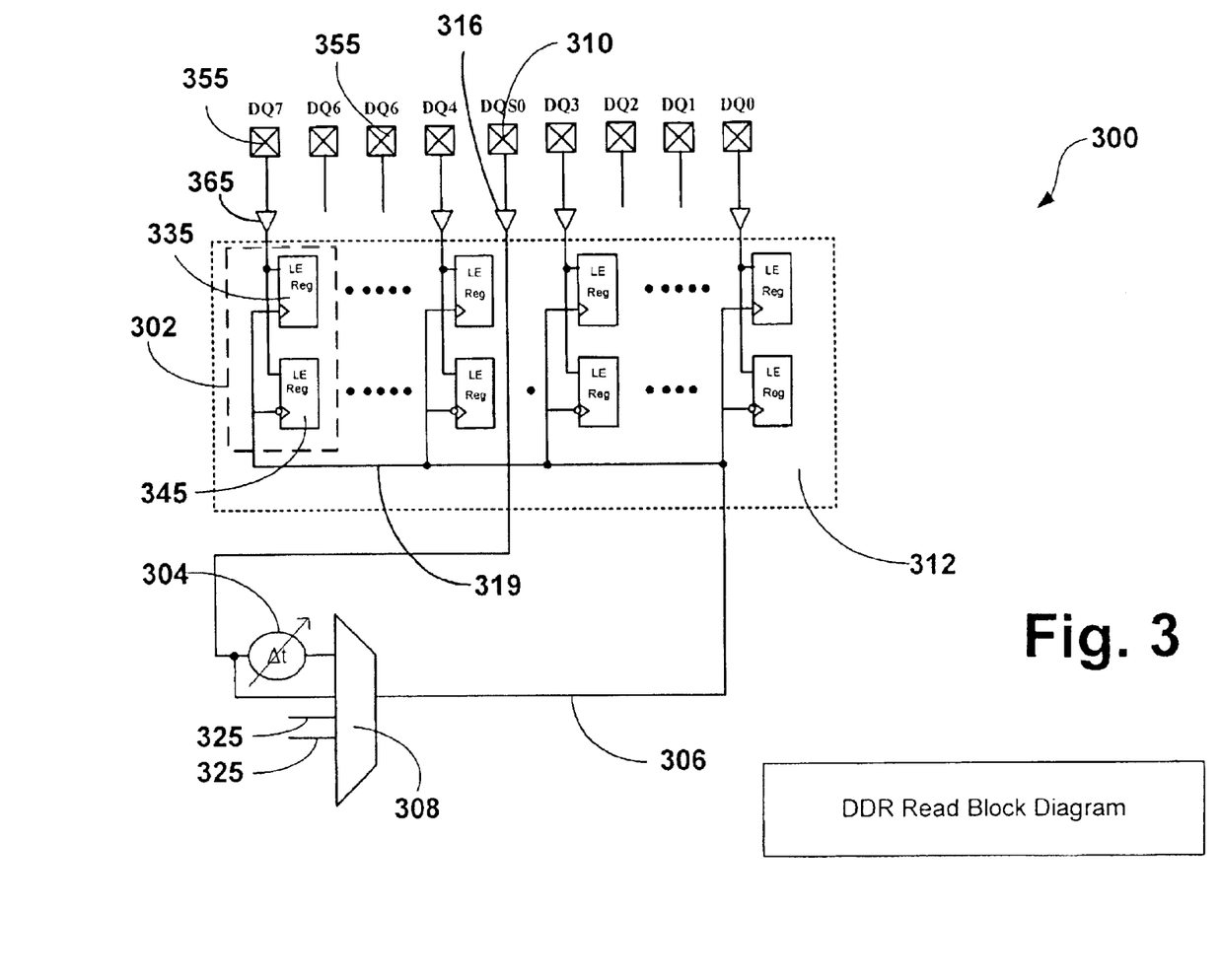
FIG. 3 shows a block diagram of a double-data rate ("DDR") interface (read mode) that may be used in accordance with the present invention.

FIG. 3 shows a block diagram of a double-data rate ("DDR") interface (read mode) that may be used in accordance with the present invention. Although the embodiments of the present invention are described in the context of a DDR system, other systems employing higher data rates may also use aspects of the present invention.

In the embodiment of FIG. 3, DDR interface 300 includes eight DQ lines 355 for receiving data and one DQS line 310 for receiving a clock signal. DQS Line 310 is preferably located at a central location vis a vis DQ lines 355. Each DQ line 355 connects to a buffer 365 which in turn is connected to a DDR register block 302 made up of a pair of data registers 335 and 345. The DDR register block 302 outputs may connect to data inputs of a static random-access memory (SRAM) or (SDRAM). Alternately, they may connect to other circuitry, such as a first-in first-out (FIFO) or other type of memory, logic, or circuitry.

DDR interface 300 additionally includes phase delay circuit 304 and multiplexer 308. Phase delay circuit 304 causes a 90 degree phase shift in the DQS signal and applies the phase shifted strobe signal to multiplexer 308. Multiplexer 308 selects between the output of the phase delay circuit 304, buffer 316, and one or more global clocks 325. The output of multiplexer 308 drives the clock input of register 335 and the clock bar input of register 345. Global clock net 306 has programmable connections to drive all input registers of DQs in the DDR interface 300. This DDR clock scheme allows the clock skew between DQ and DQS to remain within a controllable range.

DQ lines 355 are located in the periphery 50 of the programmable logic device. Registers 335 and 345 are located within the programmable logic core 40. Preferably, registers 335 and 345 are located within the logic elements 20 within the programmable logic core 40. Phase delay circuit 304, buffers 316 and 365 may be located either in periphery 50 or core 40.

DQ lines 355 may be pads that connect to package pins of an integrated circuit. Alternately, they may be internal traces on an integrated circuit. Preferably, registers 335 and 345 are flip-flops. Additionally, although the above embodiment uses eight data lines, any number of data lines may be used.

Figure 4:
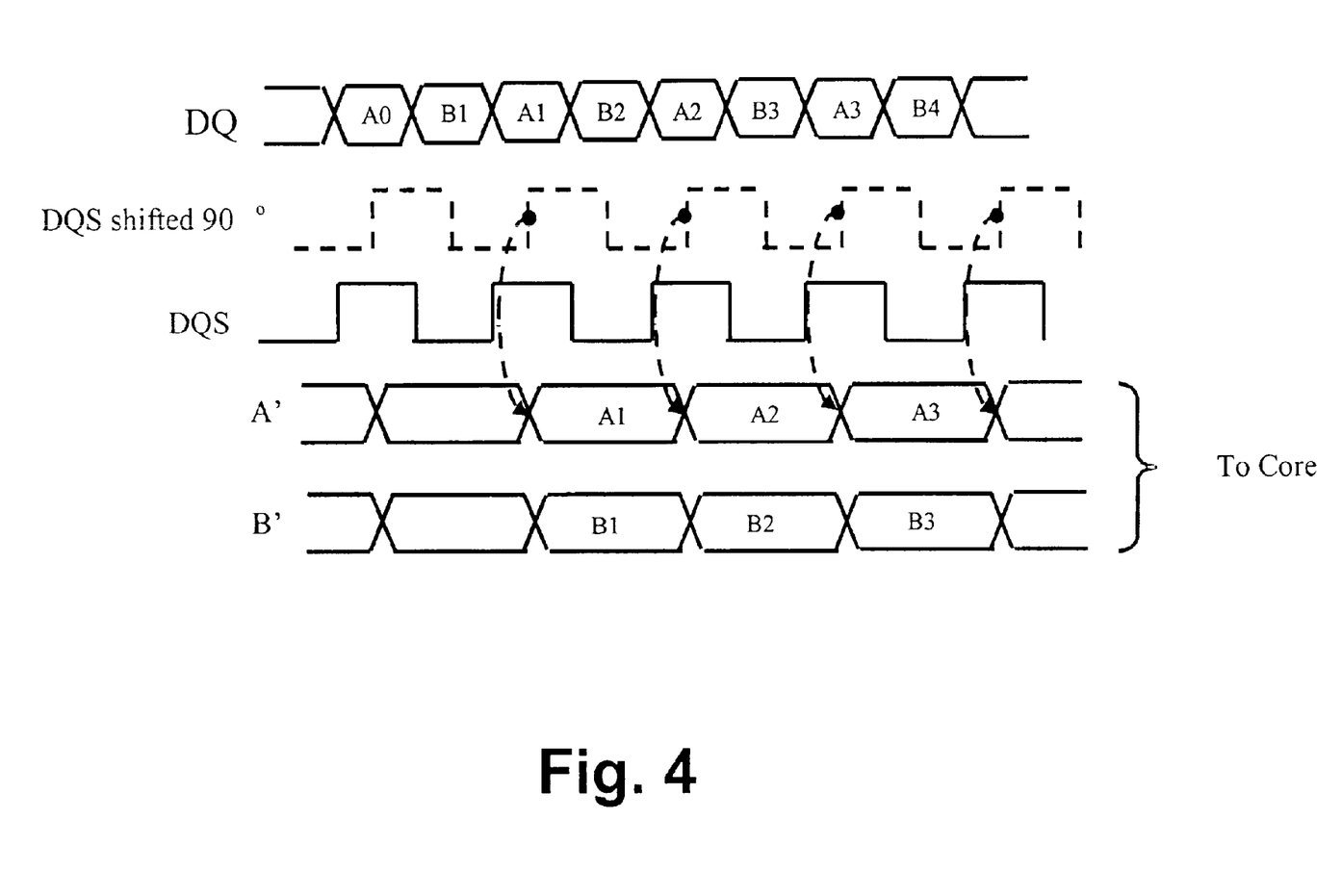
FIG. 4 illustrates the timing relationship between the clock and data signals of a DDR interface in the read mode in accordance with certain aspects of the invention.

FIG. 4 illustrates the timing relationship between the clock and data signals of a DDR interface in the read mode in accordance with certain aspects of the invention. DDR interface 300 (FIG. 3) processes data (DQ) using both the rising edge and the falling edge of a clock signal (DQS). For DDR interface operating in the read mode, DQS is normally edge-aligned with DQ. DQS is shifted by 90 degrees with respect to the DQ signal and used to latch the data transmitted onto the DQ. The rising edge of DQS latches to data A' and the falling edge of DQS latches to data B'. Preferably, A' data is processed by a register located in logic element 335 within core 312 and B' data is processed by a register located in logic element 345 which is also located within the core 312.

Figure 5:
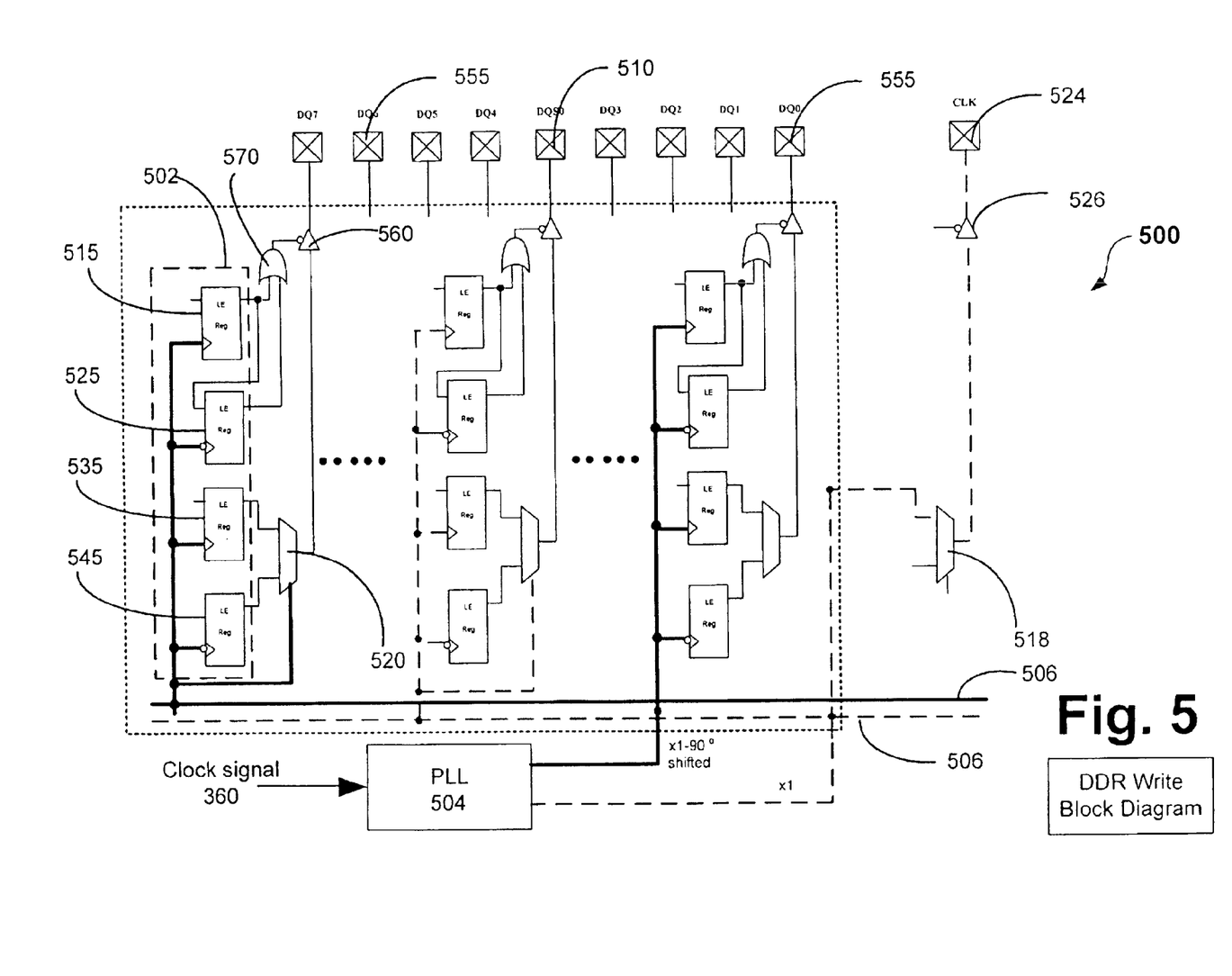
FIG. 5 shows a block diagram of a double-data rate ("DDR") interface (write mode) that may be used in accordance with the present invention.

FIG. 5 shows a block diagram of a double-data rate ("DDR") interface (write mode) that may be used in accordance with the present invention. In the embodiment of FIG. 5, DDR interface 500 includes eight DQ lines 555 for sending data and one DQS line 510 for sending a clock signal. DQS Line 510 is preferably located at a central location vis avis DQ lines 555. Each DQ line 555 connects to a buffer 560 which in turn is connected to a DDR register block 502 made up of data registers 515, 525, 535 and 545. The DDR register block 502 may receive data from data outputs of a static random-access memory (SRAM) or (SDRAM). Alternately, they may connect to other circuitry, such as a first-in first-out (FIFO) or other type of memory, logic, or circuitry.

DDR interface 500 additionally includes phase delay circuit 504. Phase delay circuit 504 causes a 90 degree phase shift in the clock signal 360 and applies the phase shifted clock signal to DDR block 502. The output of registers 535 and 545 is input to multiplexer 520. Multiplexer 520 then transmits the data to buffer 560. The output from registers 515 and 525 is transmitted to logic gate 570 which then subsequently transmits the signal to buffer 560. Registers 515, 525 and logic gate 570 determine when data is to be transmitted to pins 555 and the data from registers 545 and 535 is transmitted to pin 555 via buffer 560. During data transmission pin 555 is locked so that it does not accept either incoming signals or outgoing signals from the bus. Multiplexer 518 and buffer 526 transmit the clock and inverse clock signals to pin 524 which are then used to reduce the clock skew between the DDR clock and the system clock.

DQ lines 555 are located in the periphery 50 of the programmable logic device. Registers 515, 525, 535 and 545 are located within the programmable logic core 40. Preferably, registers 515, 525, 535 and 545 are located within the logic elements 20 within core 40. Phase delay circuit 504, multiplexeres 520 and 518, logic gates 570, buffers 560 and 526 may be located either in periphery 50 or core 40.

DQ lines 555 may be pads that connect to package pins of an integrated circuit. Alternately, they may be internal traces on an integrated circuit. Preferably, registers 515, 525, 535 and 545 are flip-flops. Additionally, although the above embodiment uses eight data lines, any number of data lines may be used.

Figure 6:
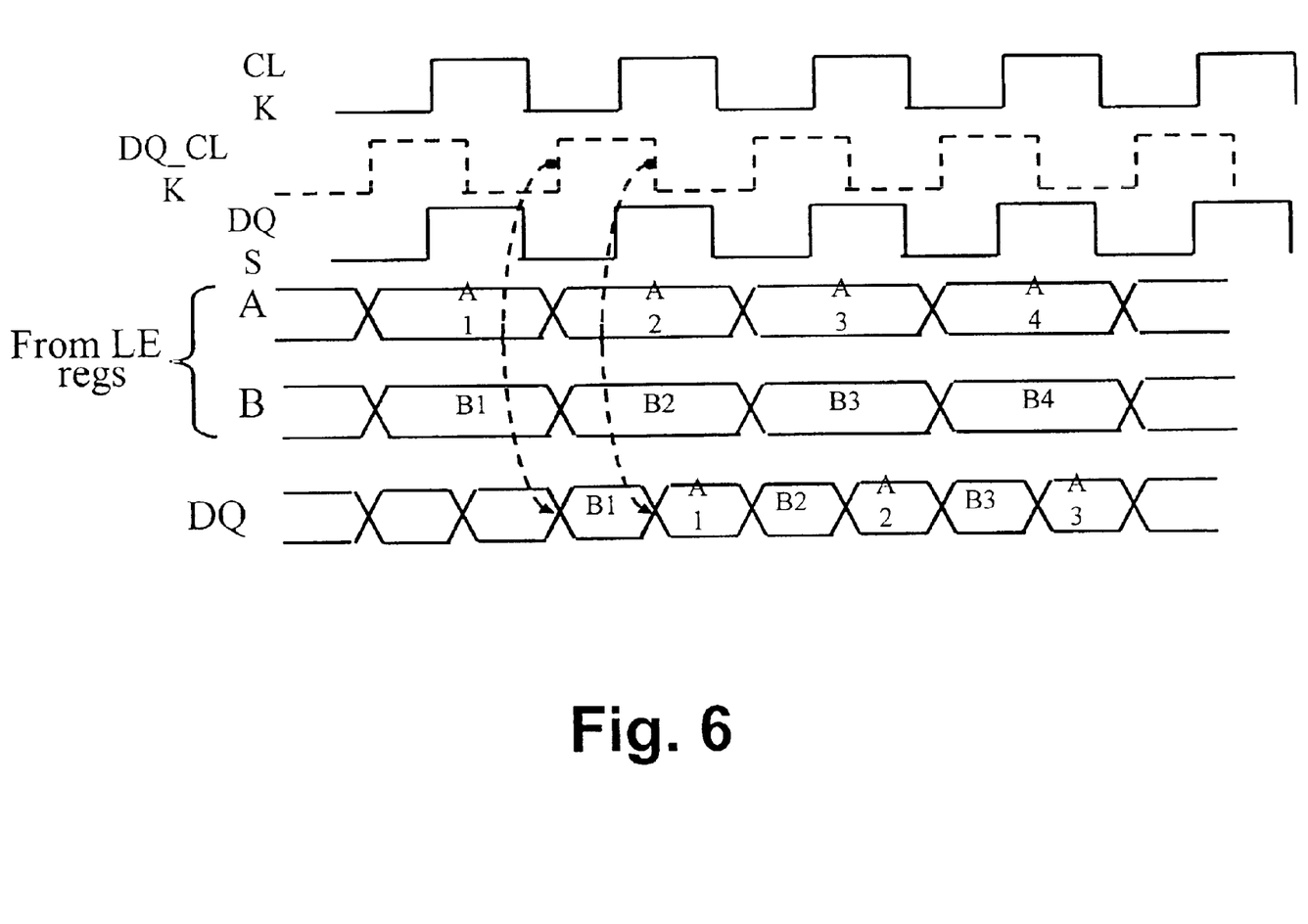
FIG. 6 illustrates the timing relationship between the clock and data signals of a DDR interface in the write mode in accordance with certain aspects of the invention.

FIG. 6 illustrates the timing relationship between the clock and data signals of a DDR interface in the write mode in accordance with certain aspects of the invention. For DDR interface operating in the write mode, DQS is normally center-aligned with DQ. DQS is shifted by 90 degree with respect to the DQ signal and used to latch the data transmitted onto the DQ. The rising edge of DQS latches to data A' and the falling edge of DQS latches to data B'.

Figure 7:
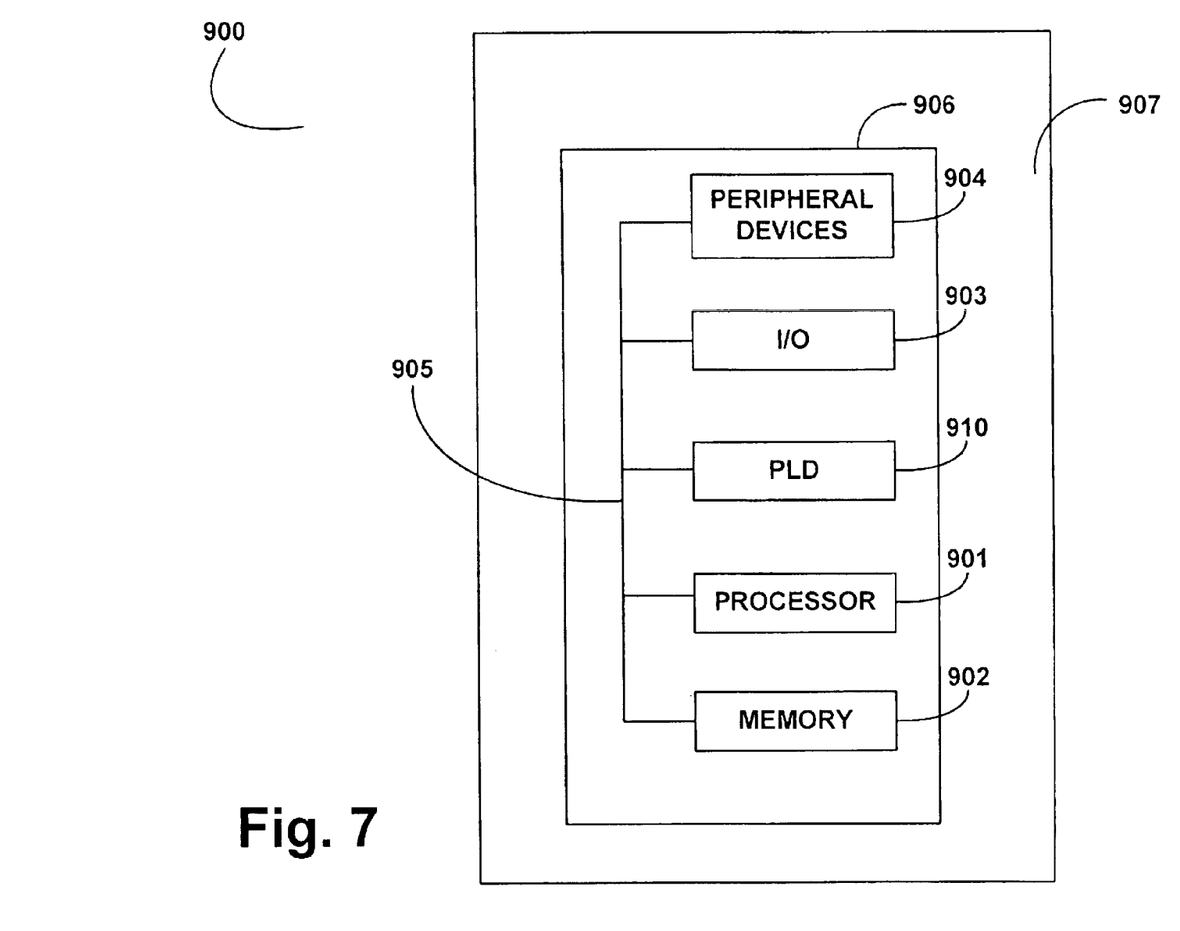
FIG. 7 illustrates a programmable logic device 910 incorporating one or more DDR interfaces in accordance with certain aspects of the invention

FIG. 7 illustrates data processing system containing a programmable logic device 910 incorporating one or more DDR interfaces according to this invention. Data processing system 900 may include one or more of the following components: a processor 901, memory 902, I/O circuitry 903, and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or re-programmable logic is desirable. Programmable logic device 910 can be used to perform a variety of different logic functions.

For example, programmable logic device 910 can be used as a processor or controller that works in cooperation with processor 901. Programmable logic device 910 may also be used as an arbiter for arbitrating access to a shared resource in system 900. In yet another example, programmable logic device 910 can be used as an interface between processor 901 and one of the other components in system 900. It should be noted that system 900 is only exemplary, and that the true scope and spirit of the invention should be indicated by the following claims.

The foregoing description of specific embodiments of the invention has been presented for the purposes of illustration and description. It is not intended to be exhaustive or to limit the invention to the precise form described. Many modifications and variations are possible in light of the teachings above. The embodiment were chosen and described in order to best explain the principles of the invention and its practical applications to thereby enable others skilled in the art to best utilize the invention in various embodiments and with various modifications as are suited to the particular use contemplated.

What is claimed is:

1. A programmable logic device (PLD) comprising:
a core and a surrounding periphery; and
a multiple data rate interface wherein at least one data register for a data register block of the multiple data rate interface is located within the core.

2. The PLD of claim 1 wherein the multiple data rate interface is a double data rate interface.

3. The PLD of claim 2 wherein the data register block comprises two data registers wherein at least one of the two data registers is located within the core.

4. The PLD of claim 3 wherein the surrounding periphery includes a plurality of DQ pins and a DQS pin.

5. The PLD of claim 4 wherein the two data registers comprising the register block are located within the core.

6. The PLD of claim 4 wherein the core further includes a plurality of DQ buffers wherein each of the plurality of DQ buffers is connected to a DQ pin and the two data registers.

7. The PLD of claim 2 wherein the data register block comprises four data registers wherein at least one of the four data registers is located within the core.

8. The PLD of claim 7 wherein the core further includes a phase-locked loop connected to the four data registers wherein the phase-locked loop is connected to a global clock.

9. The PLD of claim 8 wherein the core further includes a multiplexer connected to a first two data registers selected from the four data registers, and the multiplexer is connected to a DQ buffer wherein the DQ buffer is connected to the DQ pin.

10. The PLD of claim 9 wherein the core further includes a logic gate connected to a second two data registers selected from the four data registers, and the logic gate is connected to the DQ buffer wherein the DQ buffer is connected to the DQ pin.

11. The PLD of claim 3 wherein the at least one data register is located within a logic element wherein the logic element is one of a plurality of logic elements located within the core of the PLD.

12. The PLD of claim 5 wherein each of the two data registers are located within a logic element wherein the logic element is one of a plurality of logic elements located within the core of the PLD.

13. The PLD of claim 7 wherein the at least one data register is located within a logic element wherein the logic element is one of a plurality of logic elements located within the core of the PLD.

14. A data processing system comprising:
processing circuitry;
a memory coupled to the processing circuitry;
a programmable logic device coupled to the processing circuitry and the memory, the programmable logic device comprising a multiple data rate interface of claim 1.

15. The system of claim 14 wherein the memory is a double data rate synchronous dynamic random access memory.

16. A printed circuit board on which is mounted a programmable logic device comprising a multiple data rate interface of claim 1.

17. The printed circuit board of claim 16 further comprising a processing circuitry coupled to the programmable logic device.

18. The printed circuit board of claim 17 further comprising a memory coupled to the processing circuitry and to the programmable logic device.

* * * * *